United States Patent [19]
Klipov

[11] Patent Number: 6,090,202
[45] Date of Patent: Jul. 18, 2000

[54] METHOD AND APPARATUS FOR GROWING CRYSTALS

[75] Inventor: Vladimir A. Klipov, Highland Heights, Ohio

[73] Assignee: Sawyer Research Products, Inc., Eastlake, Ohio

[21] Appl. No.: 09/069,603

[22] Filed: Apr. 29, 1998

Related U.S. Application Data

[60] Provisional application No. 60/045,219, Apr. 30, 1997.

[51] Int. Cl.[7] .................................................. C30B 35/00
[52] U.S. Cl. ......................... 117/223; 117/224; 117/902; 117/911
[58] Field of Search ................................... 117/200, 224, 117/223, 902, 911, 16

[56] References Cited

U.S. PATENT DOCUMENTS

| | | | |
|---|---|---|---|
| 2,674,520 | 4/1954 | Sobek | 23/273 |
| 2,823,102 | 2/1958 | Selker et al. | 23/300 |
| 2,914,389 | 11/1959 | Charbonnet | 23/301 |
| 2,923,606 | 2/1960 | Hale et al. | 23/301 |
| 3,013,867 | 12/1961 | Sawyer | 23/301 |
| 3,051,558 | 8/1962 | Jost | 23/273 |
| 3,245,760 | 4/1966 | Sawyer | 23/273 |
| 3,253,893 | 5/1966 | Sawyer | 23/301 |
| 3,291,575 | 12/1966 | Sawyer | 23/301 |
| 3,607,108 | 9/1971 | Gehres | 23/273 R |
| 3,623,847 | 11/1971 | Gehres et al. | 23/301 |
| 3,635,683 | 1/1972 | Harrison et al. | 427/251 |
| 3,917,506 | 11/1975 | Lind et al. | 156/621 |
| 3,960,501 | 6/1976 | Butuzov et al. | 23/273 H |
| 4,030,966 | 6/1977 | Hornig et al. | 24/81 |
| 4,232,063 | 11/1980 | Rosler et al. | 117/101 |
| 5,069,744 | 12/1991 | Borodin et al. | 156/623 R |

FOREIGN PATENT DOCUMENTS

1-176296 of 1989 Japan ............................ C30B 29/18

*Primary Examiner*—Benjamin L. Utech
*Assistant Examiner*—Matthew Anderson
*Attorney, Agent, or Firm*—Pearne & Gordon LLP

[57] ABSTRACT

A method and apparatus for hydrothermally growing crystals in a pressure vessel containing feed crystals immersed in a mineralizing solution. The apparatus is disposed in the pressure vessel, above the mineralizing solution. The apparatus includes an enclosure having opposing major walls with passages extending therethrough. The enclosure completely surrounds a seed plate having opposing major faces. A restraining structure holds the seed plate within the enclosure such that the major faces of the seed plate are spaced inwardly from the major walls.

25 Claims, 5 Drawing Sheets

METHOD AND APPARATUS FOR GROWING CRYSTALS

CROSS-REFERENCE TO RELATED APPLICATION

This application claims the benefit of U.S. Provisional Application No. 60/045,219, filed Apr. 30, 1997.

BACKGROUND OF THE INVENTION

The present invention relates to the growth of artificial crystals, and more particularly to a method and apparatus for controlling hydrothermal crystal growth to produce crystals with a specific shape.

Hydrothermal crystal growth is the growth of crystals from solution at a high temperature and a high pressure. In a typical commercial process, a vertical autoclave holds a supply of nutrient material immersed in an aqueous solution. An upper portion of the autoclave includes a number of suspended seed plates. The autoclave is heated to increase the temperature and pressure sufficiently to dissolve the nutrient material in the aqueous solution and thereby form a nutrient solution. Typically, the autoclave is raised to a temperature of around 350° C. and a pressure of 10,000 p.s.i. A temperature gradient inside the autoclave creates convective currents, which carry the nutrient solution upward. The nutrient solution then cools and is deposited on the seed plates, thereby causing crystal growth.

Hydrothermal crystal growth is used to grow crystals composed of nutrient materials having very low solubilities in pure water. Some of these materials include quartz ($sio_2$), zinc oxide (ZnO), calcite ($CaCO_3$) and aluminum oxide ($Al2O_3$). Although these materials are more soluble under hydrothermal conditions, mineralizers are typically included in the aqueous solution to achieve reasonable solubilities. In commercial crystal growing, the mineralizers are almost always alkaline (NaOH and $Na_2CO_3$ are common choices) but neutral or acidic materials can also be used. The choice of mineralizer depends on the material being grown and the impurities which are acceptable.

The most commercially significant crystals that are grown hydrothermally are quartz crystals. Quartz crystals are commonly used in the electronics industry to manufacture quartz oscillator plates. Quartz crystals are also used in optical spectrographs and other optical devices. After being artificially grown, quartz crystals are lumbered and cut to form quartz wafers. Currently, most of the purchasers of quartz wafers desire quartz wafers having a circular shape with a portion cut away to form a reference flat. The length of a wafer extending perpendicularly from the reference flat to the outer edge of the wafer is often referred to as the segment height of the wafer. Typically, purchasers require the circular quartz wafers to have a diameter of either three inches (3") or one hundred millimeters (100 mm).

In the science of crystallography, the axes of a crystal are normally designated the x, y and z axes, each axis being angularly related to each of the other two axes. A naturally-occurring quartz crystal is elongated and has a generally hexagonal cross-section with pyramidal ends of six facets each. The z axis of the naturally occurring quartz crystal extends longitudinally thereof, while there are three x and three y axes perpendicular to the z axis. The x axes intersect the angles formed by the sides of the crystal, while the y axes are perpendicular to such sides.

In commercial growing processes, crystal growth in the direction of the z-axis is typically preferred over growth in the direction of the y-axis or growth in the direction of the x-axis. In the direction of the y-axis, growth is practically non-existent. In the direction of the x-axis, growth quickly tapers to an edge. Growth in the direction of the z-axis, however, is fast and does not quickly taper to an edge. In addition, growth in the direction of the z-axis results in considerably less impurity incorporation than in the other directions.

Seed crystals have been adapted to take advantage of the preferred growth in the direction of the z-axis. Expired U.S. Pat. No. 3,291,575 to Sawyer, which is incorporated herein by reference, shows a seed plate having its greatest length in the direction of the y-axis and its shortest length in the direction of the z-axis. In this manner, the seed plate has a length in the direction of the y-axis, a width in the direction of the x-axis and a thickness in the direction of the z-axis. Such a seed plate is often referred to as having a z-cut. A z-cut seed plate has a major face disposed substantially perpendicular to the z-axis or substantially parallel to a plane defined by the x and y axes. This major face and its companion major face on the opposite side of the z-cut seed plate are the greatest areas on the z-cut seed plate. In this manner, the z-cut seed plate promotes crystal growth in the preferred direction of the z-axis.

In many prior art commercial growing processes, seed plates are freely suspended in the autoclave. As a result, crystal growth often occurs in undesirable directions, such as in the direction of the x-axis. Crystal growth in such undesirable directions tends to be flawed and produces crystals having a shape and size that is not conducive to efficient commercial utilization.

In order to prevent undesirable crystal growth, some prior art processes suppress crystal growth in the direction of the x-axis using restrictor plates or shields. Examples of such prior art processes include those shown in U.S. Pat. No. 5,069,744 to Borodin et al., U.S. Pat. No. 3,607,108 to Gehres, U.S. Pat. No. 3,013,867 to Sawyer, U.S. Pat. No. 2,674,520 to Sobek, and Sawyer 575', all of which are incorporated herein by reference.

Even if crystal growth in undesirable directions is suppressed in a process by restrictor shields, the crystals that are grown in the process will still have a shape that is not conducive to efficient commercial utilization. The restrictor shields will produce crystals with planar sides and sharp angles. These planar sides and sharp angles will have to be eliminated by a substantial amount of lumbering in order to produce the desired circular wafers.

Based upon the foregoing, there is a need in the art for a method and apparatus for forming crystals having a shape conducive to efficient utilization. The present invention is directed to such a method and apparatus.

SUMMARY OF THE INVENTION

It therefore would be desirable, and is an advantage of the present invention, to provide a method and apparatus for forming crystals having a shape conducive to efficient utilization. In accordance with the present invention, an apparatus is provided for shaping a crystal grown from a seed crystal. The apparatus includes an enclosure for disposal around the seed crystal. The enclosure has a plurality of passages extending therethrough. The apparatus also includes a retaining structure for holding the seed crystal within the enclosure.

Also provided in accordance with the present invention is an assembly for hydrothermally growing a crystal. The assembly includes a pressure vessel containing a basket filled with feed material and a mineralizing solution. The basket is immersed in the mineralizing solution. A rack is provided having a mounting frame. The rack is disposed within the pressure vessel, above the mineralizing solution. A seed plate is provided having opposing major faces. An apparatus is suspended from the mounting frame. The apparatus includes an enclosure and a retaining structure. The enclosure surrounds the seed plate. The retaining structure holds the seed plate within the enclosure such that the seed plate is fully disposed within the enclosure.

Also provided in accordance with the present invention is a method of producing a crystal. Pursuant to the method, a pressure vessel, a mineralizing solution, feed material, a feed basket, and a seed plate having major faces are selected. An apparatus having an enclosure for surrounding the seed plate is also selected. The pressure vessel is partially filled with the mineralizing solution, and the feed basket is filled with the feed material. The feed basket is disposed in the pressure vessel such that the feed basket is immersed in the mineralizing solution. The seed plate is mounted within the enclosure such that the seed plate is fully disposed within the enclosure. The apparatus is suspended inside the pressure vessel, above the mineralizing solution. The pressure vessel is sealed and heated to a temperature wherein hydrothermal crystal growth occurs on the seed plate.

Also provided in accordance with the present invention is a method of producing generally circular crystal wafers. In this method, a pressure vessel is selected containing a basket filled with feed material and a mineralizing solution. The basket is immersed in the mineralizing solution. A seed plate having major faces is selected. An apparatus is selected having an enclosure for surrounding the seed plate. The enclosure has a generally elliptical cross-section with major and minor axes. The seed plate is mounted within the enclosure such that the major faces of the seed plate are disposed along the major axis of the cross-section. The apparatus is suspended inside the pressure vessel, above the mineralizing solution. The pressure vessel is sealed and heated to a temperature wherein hydrothermal crystal growth occurs on the seed plate. Crystal growth is allowed to continue on the seed plate until crystal growth on the major faces reach the enclosure and a generally cylindroidal crystal is thereby formed. The apparatus is removed from the pressure vessel and the crystal is removed from the apparatus. A plurality of parallel cuts are made through the crystal transverse to the longitudinal axis of the crystal and at an acute angle thereto.

Also provided in accordance with the present invention is a method of producing a crystal, wherein a vessel, feed material, and a seed crystal are selected. The apparatus has an enclosure for surrounding the seed crystal. The enclosure has a plurality of passages extending therethrough. The vessel is partially filled with the feed material. The seed crystal is mounted within the enclosure such that the seed crystal is fully disposed within the enclosure. The apparatus is disposed inside the vessel and the vessel is heated to a temperature wherein crystal growth occurs on the seed crystal.

BRIEF DESCRIPTION OF THE DRAWINGS

The features, aspects, and advantages of the present invention will become better understood with regard to the following description and accompanying drawings where.

DETAILED DESCRIPTION OF THE PREFERRED EMBODIMENTS

It should be noted that in the detailed description which follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

Figure 1:
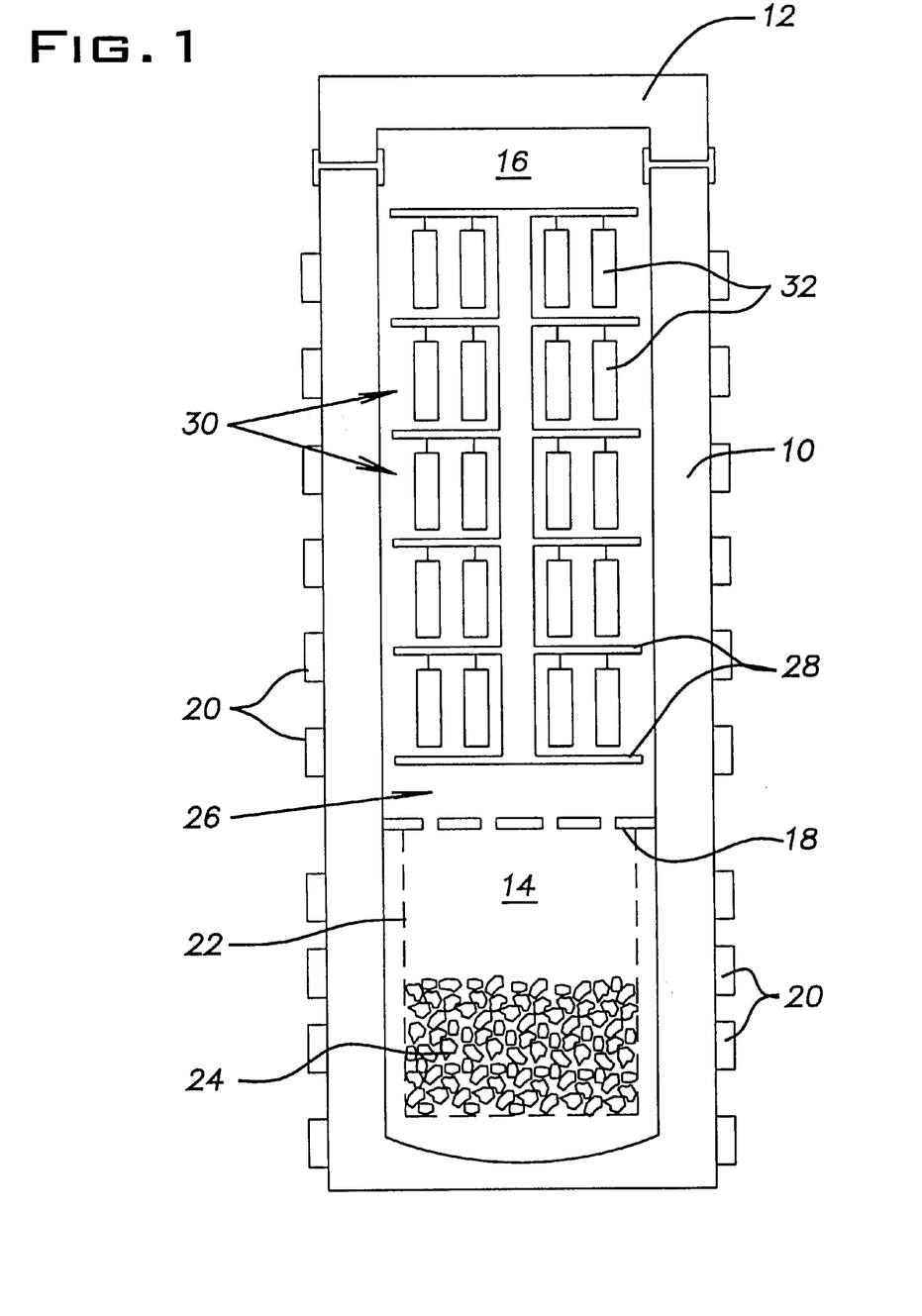
FIG. 1 shows a schematic view of an autoclave.

Referring now to FIG. 1, there is shown a schematic view of an autoclave 10 in which the method and apparatus of the present invention may be used. The autoclave 10 is generally cylindrical and has an inside diameter of approximately 13 inches (33 centimeters) and an interior volume of about 78.2 gallons (296 liters). The autoclave 10 has a top opening that is sealed with a plug 12. The plug 12 can be of the Bridgman type or the Grayloc type.

The autoclave 10 has a mineral-dissolving region, or supply chamber 14, and a seed-growing chamber 16. The supply chamber 14 and the seed-growing chamber 16 are separated by a perforated baffle 18. Electrically resistive heaters 20 are secured around an exterior surface of the autoclave 10. A control system (not shown) is connected to the heaters 20 and provides independent control of the temperatures in the supply chamber 14 and the seed-growing chamber 16. A data acquisition system (not shown) may be provided to monitor the operating parameters inside the autoclave 10, such as temperature and pressure.

It is considered apparent that the present invention is not limited to the foregoing autoclave. Rather, other autoclaves may be employed with equal functionality and without departing from the scope and spirit of the present invention as embodied in the claims appended hereto.

A feed basket 22 is filled with feed stock crystal 24. Preferably, the feed stock crystal 24 is comprised of quartz. However, other types of feed stock crystal may be used, such as zinc oxide (ZnO), calcite ($CaCO_3$) and aluminum oxide ($Al2O_3$). The feed basket 22 with the feed stock crystal or "lascas" 24 is disposed in the supply chamber 14. Disposed within the seed-growing chamber 16 is a rack 26 having a plurality of vertically-spaced mounting frames 28 defining a plurality of vertical seed-growing tiers 30. A plurality of seed-holding assemblies 32 are hung from each of the mounting frames 28. The seed-holding assemblies 32 each hold a seed crystal or seed plate 33 (shown in FIG. 2).

A mother liquor or mineralizing solution preferably composed of sodium carbonate or sodium hydroxide, or a mixture of both is added to the autoclave 10 and immerses the lascas 24. Preferably, about 78% of the free volume of the autoclave 10 is filled with the mineralizing solution. Preferably, about a 7% sodium carbonate solution, or about a 5% sodium hydroxide solution is used.

Figure 2:
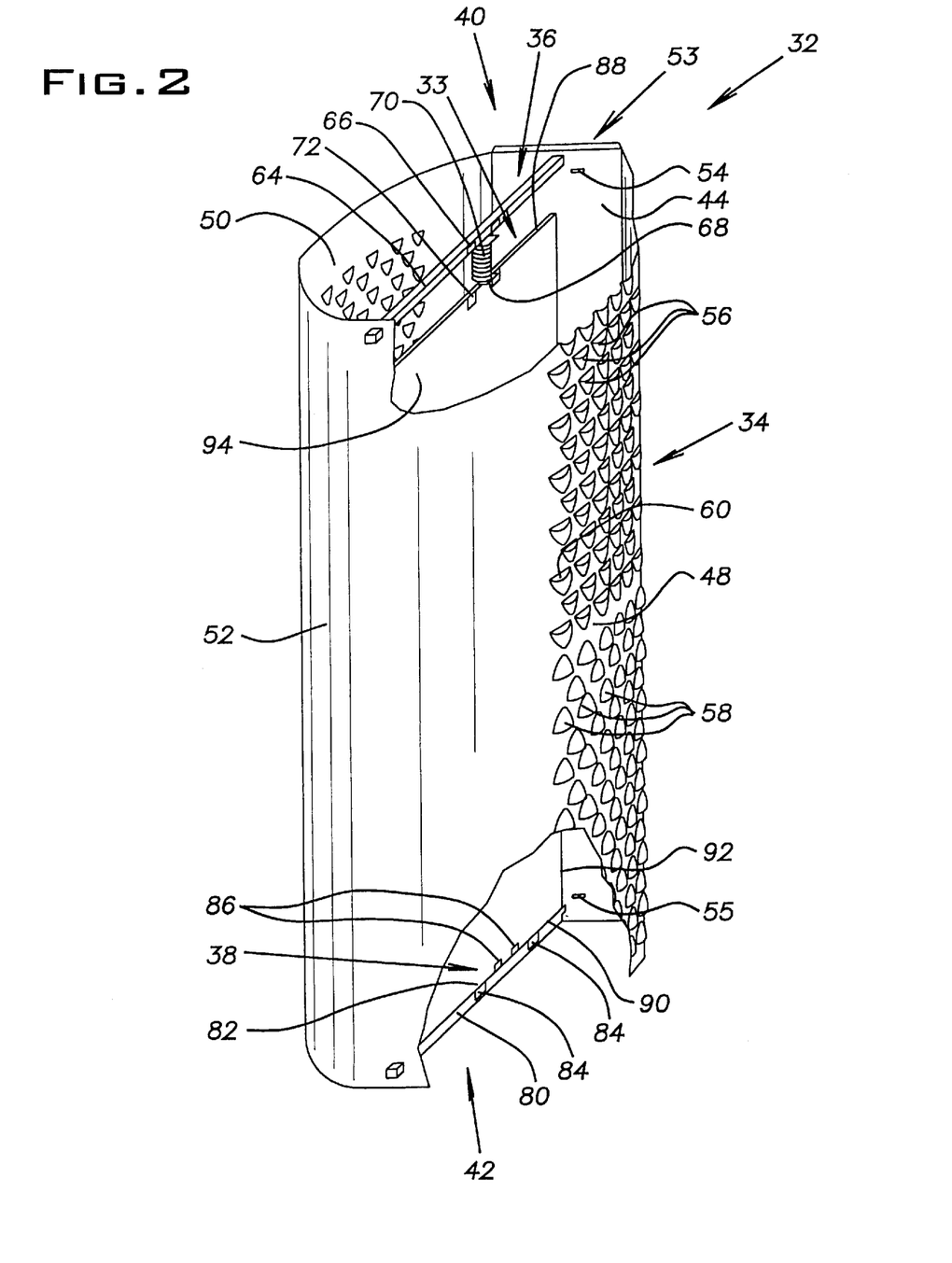
FIG. 2 shows a front perspective view of a first seed-holding assembly.

Referring now to FIG. 2 there is shown a front perspective view of one of the seed-holding assemblies 32 with a portion cut away to better show the interior thereof. The seed-holding assembly 32 is constructed in accordance with a first embodiment of the present invention and generally includes an enclosure or restrictor 34, an upper support 36, and a lower support 38. The seed-holding assembly 32 is utilized to grow a single quartz crystal from which a plurality of circular quartz wafers may be obtained.

Figure 3:
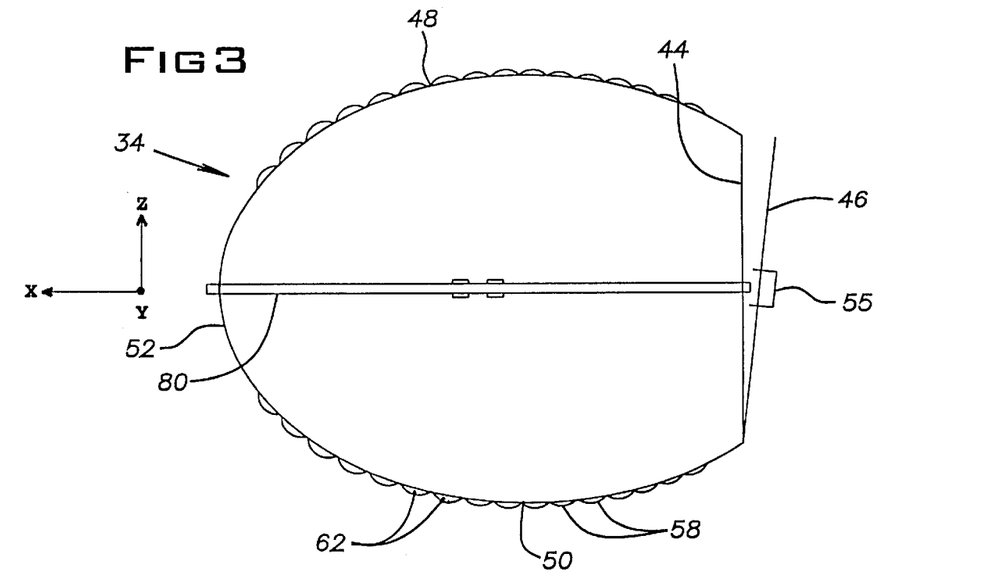
FIG. 3 shows a bottom view of the first seed-holding assembly.

The restrictor 34 has a hollow interior and open top and bottom ends 40, 42. The restrictor 34 is preferably formed from a sheet of low carbon steel having first and second side portions 44, 46 (shown best in FIG. 3). The sheet is configured so as to provide the restrictor 34 with a cylindroidal shape. As best shown in FIG. 3, the restrictor 34 has a cross-section (taken at a right angle to a longitudinal axis of the restrictor 34) that is shaped like an ellipse with a portion cut away to form a straight edge. Since the cross-section is generally elliptical, the restrictor 34 has a width along the major axis of the cross-section and a depth along the minor axis of the cross-section. As will be described in more detail later, the width and the depth of the restrictor 34 are dependent upon the size of the quartz wafers that are desired to be produced. If 3" wafers are desired, the width of the restrictor 34 is preferably in a range of about 3.0" to 3.75", more preferably about 3.25", and the depth is preferably in a range of about 2.3" to 3.3", more preferably about 2.8". If 100 mm wafers are desired, the width of the restrictor 34 is preferably in a range of about 4.0" to 4.75", more preferably about 4.25", and the depth is in a range of about 3.3" to 4.3", more preferably about 3.8". The restrictor 34 has a length preferably in a range of about 12" to 18", more preferably about 12.5".

It should be appreciated that the restrictor 34 can be sized to produce wafers other than 3" or 100 mm wafers. For example, the restrictor 34 can also be sized to produce 6" wafers.

Referring now also to FIG. 3, the restrictor 34 has first and second major walls 48, 50 and an arcuate first side wall 52. The first and second side portions 44, 46 overlap each other and are releasably secured together by upper and lower fasteners 54, 55 so as to form a second side wall 53. The upper and lower fasteners 54, 55 may be generally U-shaped staples having a pair of legs extending from a bight.

The first and second side portions 44, 46 of the restrictor 34 each define a pair of upper holes (not shown) and a pair of lower holes (not shown). The upper and lower holes in the first side portion 44 are respectively aligned with the upper and lower holes in the second side portion 46. The legs of the upper staple 54 extend through the upper openings, while the legs of the lower staple 55 extend through the lower openings. With regard to each of the upper and lower fasteners 54, 55, the legs are bent inward, toward each other, so to clasp the first and second side portions 44, 46 between the bight and the legs.

When the legs of the upper and lower fasteners 54, 55 are unclasped, the first and second side portions 44, 46 can be moved apart to open the restrictor 34 and thereby provide access to the interior of the restrictor 34. In FIG. 3, the upper and lower fasteners 54, 55 are shown unclasped and the second side portion 46 is shown extending outward, away from the first side portion 44.

A plurality of upper protuberances 56 and a plurality of lower protuberances 58 are formed in the first and second major walls 48, 50 of the restrictor 34. The upper protuberances 56 are arranged in a pattern having an upper boundary spaced downward from the top end 40 of the restrictor 34 and a lower boundary located approximately midway along the length of the restrictor 34. The lower protuberances 58 are arranged in a pattern having a bottom boundary spaced upward from the bottom end 42 of the restrictor 34 and an upper boundary located approximately midway along the length of the restrictor 34, adjacent the lower boundary of the upper protuberances 56.

Each of the upper and lower protuberances 56, 58 is generally semi-conical in shape. The upper and lower protuberances 56, 58, however, are oppositely directed. The upper protuberances 56 each flare outwardly and upwardly from a closed bottom end to a top end defining an upwardly-directed opening 60, while the lower protuberances 58 each flare outwardly and downwardly from a closed top end to a bottom end defining a downwardly-directed opening 62 (shown in FIG. 3).

Figure 4:
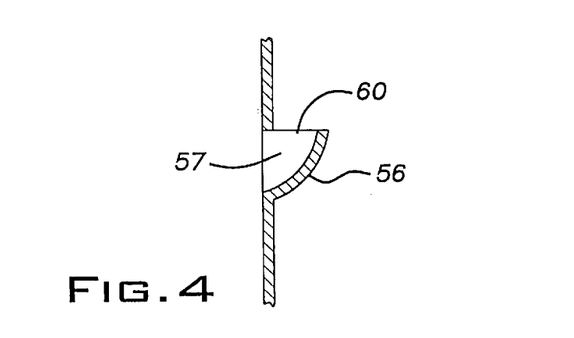
FIG. 4 shows a sectional view of an upper protuberance.
Figure 5:
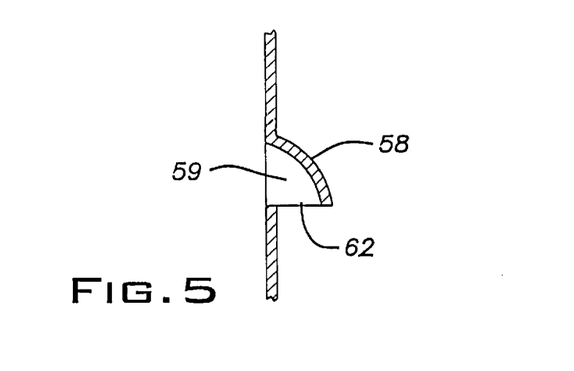
FIG. 5 shows a sectional view of a lower protuberance.

Referring now to FIGS. 4 and 5, there is respectively shown a sectional view of one of the upper protuberances 56 and one of the lower protuberances 58. The upper protuberance 56 defines an upper passage 57 that extends arcuately upward through the restrictor 34, from the interior to the exterior thereof. The lower protuberance 58 defines a lower passage 59 that extends arcuately downward through the restrictor 34, from the interior to the exterior thereof. The upper and lower passages 57, 59 do not extend linearly through the restrictor 34 in a direction parallel to the cross-section of the restrictor 34. In contrast, crystal growth on the major faces 94 of the seed plate 33 extends linearly in a direction parallel to the cross-section of the restrictor, as will be discussed more fully later. Thus, the crystal that is grown inside the restrictor 34 cannot grow through the upper and lower passages 57, 59.

Although the crystal cannot grow through the upper and lower passages 57, 59, growing solution can flow through the upper and lower passages 57, 59. In this manner, the upper and lower passages 57, 59 permit growing solution to be conveyed or transferred through the first and second major walls 48, 50 so as to contact the major faces 94 of the seed plate 33. This transfer of growing solution through the first and second major walls 48, 50 is critical when the crystal inside the restrictor 34 approaches the first and second major walls 48, 50. If growing solution is not transferred through the first and second major walls 48, 50 at this point, the major faces 94 starve of growing solution and crystal growth terminates short of the first and second major walls 48, 50. Thus, the upper and lower passages 57, 59 permit the crystal to grow up to, but not through the first and second major walls 48, 50.

Referring back to FIG. 2, the upper support 36 includes an elongated top bar 64 mounted to the restrictor 34, toward the top end 40. An end of the top bar extends through an opening formed in the first side wall 52 of the restrictor 34, while an opposite end (not shown) of the top bar extends through aligned openings formed in the first and second side portions 44, 46 of the restrictor 34. The top bar 64 is disposed along the major axis of the cross section of the restrictor 34 and is slidable through the openings in the restrictor 34.

The upper support 36 also includes a mounting plate 66 and a top clip 68. The mounting plate 66 is secured to the top bar 64 and is connected to a top end of a spring 70. The top clip 68 has an elongated body with opposing end portions. A pair of spaced-apart arms 72 extend downwardly from each of the end portions. The body of the top clip 68 is secured to a bottom end of the spring 70 so as to be resiliently connected to the mounting plate 66. The arms 72 clasp a top portion of the seed plate 33.

The lower support 38 includes an elongated bottom bar 80 mounted to the restrictor 34, toward the bottom end 42. An end of the bottom bar 80 extends through an opening formed in the first side wall 52 of the restrictor 34, while an opposite end (not shown) of the bottom bar 80 extends through aligned openings formed in the first and second side portions 44, 46 of the restrictor 34. The bottom bar 80 is aligned with the top bar 64 of the upper support 36 and, thus, is disposed along the major axis of the cross section of the restrictor 34. The bottom bar 80 is slidable through the openings in the restrictor 34.

The lower support 38 includes a bottom clip 82. The bottom clip 82 has an elongated body with opposing end portions. A pair of spaced-apart lower arms 84 extend downwardly from each of the opposing end portions. Two pairs of spaced-apart upper arms 86 extend upward from the body, in between the lower arms 84. The lower arms 84 clasp the bottom bar 80, while the upper arms 86 clasp a lower portion of the seed plate 33.

The seed plate 33 is generally rectangular and has a z-cut. As such, the seed plate 33 has a length in the direction of its crystallographic y-axis, a width in the direction of its crystallographic x-axis and a thickness in the direction of its crystallographic z-direction. In this manner, the seed plate 33 has top and bottom edges 88, 90 perpendicular to the y-axis, side edges 92 perpendicular to the x-axis and opposing major faces 94 perpendicular to the z-axis.

With the top portion of the seed plate 33 clasped between the arms 72 of the top clip 68 and the bottom portion of the seed plate 33 clasped between the upper arms 86 of the bottom clip 82, the seed plate 33 is securely disposed within the interior of the restrictor 34. The top edge 88 of the seed plate 33 abuts the body of the top clip 68, while the bottom edge 90 of the seed plate 33 abuts the body of the bottom clip 82. The width of the seed plate 33 extends along the major axis of the cross section of the restrictor 34, and the side edges 92 of the seed plate 33 respectively abut the first side wall 52 in the restrictor 34 and the first side portion 44 of the restrictor 34. The major faces 94 of the seed plate 33 are disposed perpendicular to the cross-section of the restrictor 34 and are spaced inward from the first and second major walls 48, 50 of the restrictor 34. Thus, the major faces 94 of the seed plate 33 are directed toward the upper and lower passages 57, 59 in the restrictor 34 and the z-axis of the seed plate 33 extends parallel to the cross-section of the restrictor 34. Accordingly, the upper and lower passages 57, 59 are non-linear in the direction of the z-axis of the seed plate 33.

Once all of the seed plates 33 are mounted inside the seed-holding assemblies 32 in the foregoing manner, the seed-holding assemblies 32 are hung from the mounting frames 28 of the rack 26. The seed-holding assemblies 32 are spaced apart within each tier 30 and between tiers 30 so as to permit fluid to flow around each seed-holding assembly 32. If the restrictors 34 are sized to produce 3" wafers, preferably five (5) seed-growing tiers 30 are utilized, with preferably eight (8) seed-growing assemblies 32 being disposed in each tier 30, for a total of forty (40) seed-growing assemblies 32. If the restrictors 34 are sized to produce 100 mm wafers, preferably five (5) seed-growing tiers 30 are utilized, with preferably six (6) seed-growing assemblies 32 being disposed in each tier 30, for a total of thirty (30) seed-growing assemblies 32. After all of the seed-holding assemblies 32 have been hung from the mounting frames 28, the rack 26 is inserted into the autoclave 10 through the top opening. Inside the autoclave 10, the restrictors 34 are disposed with their lengths extending vertically.

Once the seed-holding assemblies 32 are loaded into the autoclave 10, the plug 12 is sealed and the heaters 20 are energized by the control system. The heaters 20 raise the temperature of the seed-growing chamber 16 and the supply chamber 14 until setpoint temperatures are reached. The control system then manipulates the heaters 20 to maintain the seed-growing chamber 16 and the supply chamber 14 at the setpoint temperatures. Preferably, the setpoint temperature for the supply chamber 14 is programmed for a temperature in a range of about 345° C. to 360° C. The setpoint temperature for the seed-growing chamber 16 is preferably programmed to be between 5° C. to 10° C. cooler than the setpoint of the supply chamber 14 so as to create a temperature gradient across the baffle 18. The pressure within the autoclave 10 is maintained at a pressure in a range of about 11,000 psi to 13,000 psi, more preferably about 12,000 psi.

The elevated temperature and pressure of the autoclave 10 causes the lascas 24 in the feed basket 22 to dissolve in the mineralizing solution and form a growing solution. Due to the temperature differential between the supply chamber 14 and the seed-growing chamber 16, thermal currents of growing solution flow upward from the supply chamber 14 and enter the seed-growing chamber 16. The thermal currents flow upward along an upflow portion of the seed-growing chamber 16 and then, toward the top opening, change direction and flow downward along a downflow portion of the seed-growing chamber 16. In this manner, a circular flow of growing solution continually moves between the supply chamber 14 and the seed-growing chamber 16.

With regard to each of the seed-holding assemblies 32, the circular flow of growing solution enters the restrictor 34, contacts the seed plate 33 and then exits the restrictor 34. If the seed-holding assembly 32 is located in the upflow portion of the seed-growing chamber 16, the growing solution enters the restrictor 34 through the bottom end 42 and the lower passages 59 in the restrictor 34, and exits the restrictor 34 through the top end 40 and the upper passages 57 in the restrictor 34. Conversely, if the seed-holding assembly 32 is located in the downflow portion of the seed-growing chamber 16, the growing solution enters the restrictor 34 through the top end 40 and the upper passages 57 in the restrictor 34, and exits the restrictor 34 through the bottom end 42 and the lower passages 59 in the restrictor 34. In this manner, the restrictor 34 accommodates the circular flow of the growing solution regardless where the restrictor 34 is placed in the seed-growing chamber 16.

Within the seed-growing chamber 16, the growing solution cools and becomes super-saturated with respect to the dissolved quartz. As a result, the growing solution deposits quartz on the seed plates 33 as the growing solution flows over the seed plates 33, thereby causing crystal growth.

With regard to each seed plate 33, crystal growth on the side edges 92 in the direction of the x-axis is effectively suppressed by the first side wall 52 of the restrictor 34 and the first side portion 44 of the restrictor 34. Growth on the top and bottom edges 88, 90 in the direction of the y-axis is negligible. Growth in the direction of the z-axis, however, is fast. Therefore, crystal growth occurs almost entirely on the major faces 94 in the direction of the z-axis, which is perpendicular to the major faces 94 of the seed plate 33 and is parallel to the cross-section of the restrictor 34.

As the crystal grows, rhombohedral surfaces form in non-favored directions, i.e., directions other than the z-axis. Crystal growth on these rhombohedral surfaces in the non-favored directions, however, is slower than crystal growth on the major faces 94 in the direction of the z-axis.

Crystal growth in the direction of the z-axis continues until it reaches the restrictor 34, at which point it is physically suppressed by the first and second major walls 48, 50. Since the crystal growth is linear in the direction of the z-axis and the upper and lower passages 57, 59 are non-linear in the direction of the z-axis, the crystal growth cannot extend through the upper and lower passages 57, 59. Thus, crystal growth in the direction of the z-axis stops.

It should be appreciated from the foregoing that it is critical that the upper and lower passages 57, 59 do not extend linearly through the restrictor 34 in the direction of the z-axis of the seed plate 33. The upper and lower passages 57, 59, however can have configurations different from those described herein. For example the upper and lower passages 57, 59 can be serpentine.

Even though crystal growth in the direction of the z-axis is suppressed, crystal growth on the rhombohedral surfaces in the non-favored directions continues and, in fact, speeds up. This crystal growth in the non-favored directions continues until it reaches the restrictor 34, at which point it is also physically suppressed. In this manner, the crystal fills out the internal dimensions of the restrictor 34 and thereby assumes a cylindroidal shape having a cross-section shaped like an ellipse with a portion cut away to form a reference flat.

From extensive crystal growing data, the growth of a crystal in the autoclave 10 for a given set of operating parameters can be tracked with a substantial degree of accuracy. Therefore, the time it will take for the crystal to fill in the restrictor 34 can be determined with a substantial degree of accuracy without using gammagraph measurements of the crystal. Since the restrictor 34 completely suppresses crystal growth after the crystal fills in the restrictor 34, over-growth of the crystal is not a concern. Therefore, extra time can be added to the calculated growth time to ensure complete crystal growth. The growth time is approximately four months for a crystal that produces 3" wafers and six months for a crystal that produces 100 mm wafers.

Once the run of the autoclave 10 is complete, the control system turns off the heaters 20 and the autoclave 10 is permitted to cool. Subsequently, the plug 12 is opened and the rack 26 is removed from the autoclave 10. The seed-holding assemblies 32 are then taken off the rack 26 and the crystals removed from the interiors thereof. With regard to each of the seed-holding assemblies 32, the crystal is removed from the seed-holding assembly 32 by unclasping the upper and lower fasteners 54, 55 and separating the first and second side portions 44, 46 so as to open the restrictor 34. The crystal is then removed from the seed-holding assembly 32 through the restrictor 34, with or without the upper and lower supports 36, 38.

After the crystal has been removed from the seed-holding assembly 32, the crystal may be cut into a plurality of wafers. Specifically, a plurality of parallel cuts may be made through the crystal transverse to the crystal's longitudinal axis (the crystallographic y-axis). The cuts are each made at an acute angle to the z-axis. This angle is determined by customer specification and is typically in a range of about 31° to 43°. Of course, cuts at angles outside this range can also be made. Cutting the crystal at an acute angle forms generally circular wafers. More specifically, the wafers are circular with a portion cut away to form a reference flat.

As can be appreciated from the foregoing, the depth of each restrictor 34 is determined by the angle at which the crystal is to be cut and the desired diameter of the resulting wafers. Specifically, the depth is equal to the desired diameter (plus a machining tolerance) multiplied by the COSINE of the angle at which the crystal is to be cut. In order to avoid having a multitude of differently-sized restrictors 34, the depth of each restrictor 34 may be calculated using an angle of 31° since most crystals are cut at an angle of at least 31°. If the angle for a particular crystal is greater than 31°, the crystal can be lumbered to reduce the width of the crystal. As set forth earlier, if the restrictor 34 is to produce 3" wafers, the depth is preferably about 2.8" and if the restrictor 34 is to produce 100 mm wafers, the depth is preferably about 3.8".

The width of each restrictor 34 is determined by the segment height of the wafers. Specifically, the width is equal to the segment height plus a machining tolerance. As set forth earlier, if the restrictor 34 is to produce 3" wafers, the width is preferably about 3.25" and if the restrictor 34 is to produce 100 mm wafers, the width is preferably about 4.25".

Once the crystal has been cut, the wafers are temporarily glued back together to re-form the crystal. The crystal is then lumbered on a lathe to remove any surface irregularities that may be present. After lumbering, the glue is dissolved to reobtain the wafers.

It should be appreciated that the present invention is not limited to a restrictor having a cylindroidal shape with a generally elliptical cross-section. Restrictors having a different shape can be provided. The desired shape of a crystal that is to be produced determines the shape of the restrictor 34 that is used.

Figure 6:
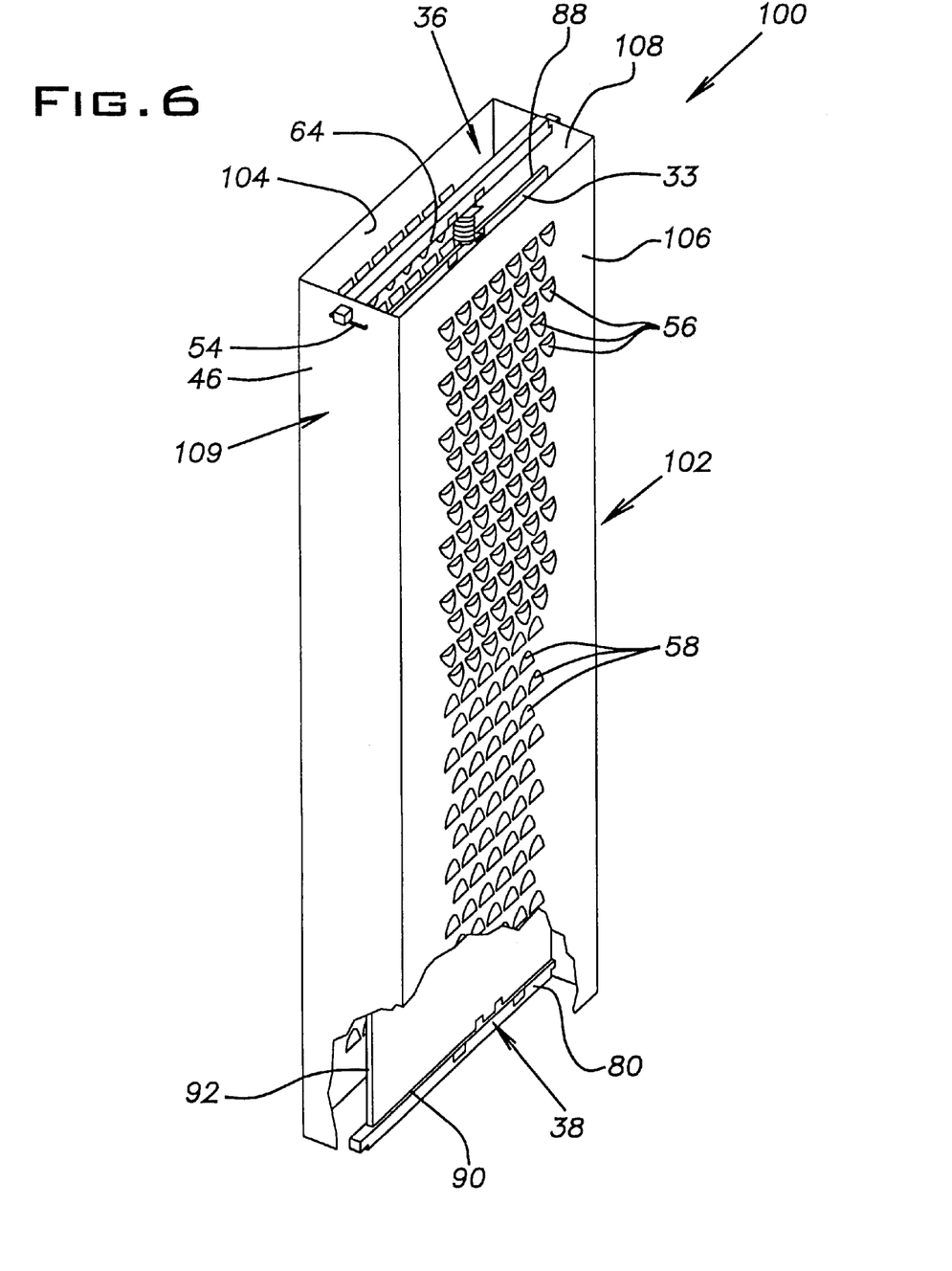
FIG. 6 shows a rear perspective view of a second seed-holding assembly.

Referring now to FIG. 6, there is shown a second embodiment of the present invention. specifically, FIG. 6 is a rear perspective view of a second seed-holding assembly 100 having essentially the same construction as the seed-holding assembly 32 of the first embodiment except for the differences to be hereinafter described. The restrictor 34 has been replaced by a second restrictor 102. The second restrictor 102 is preferably comprised of a sheet of low carbon steel configured to have a rectangular shape. The second restrictor 102 includes the first and second side portions 44, 46, as well as planar major walls 104, 106, and first and second side walls 108, 109. The upper and lower protuberances 56, 58 are formed in the major walls 104, 106 in the same patterns as in the restrictor 34. The first and second side portions 44, 46 are releasably secured together in the same manner as in the restrictor 34 so as to form the second side wall 109.

The seed plate 33 is securely disposed within the interior of the second restrictor 102. The side edges 92 of the seed plate 33 respectively abut the first side wall 108 and the first side portion 44 of the second restrictor 102, and the major faces 94 of the seed plate 33 are directed toward the upper and lower passages 57, 59 in the second restrictor 102. The second restrictor 102 is disposed in the autoclave 10 with its length extending vertically.

Under conditions similar to those described above for the first embodiment, a second crystal is grown in the second restrictor 102. The second crystal, however, is substantially rectangular instead of being generally cylindroidal. The second crystal can be cut to form a plurality of rectangular y-cut wafers, or a plurality of rectangular seed plates. In order to produce rectangular y-cut wafers, a plurality of parallel cuts are made through the crystal substantially perpendicular to the crystal's longitudinal axis (the crystallographic y-axis). In order to produce rectangular seed plates, a plurality of parallel cuts are made through the crystal parallel to the crystallographic y-axis.

It should also be appreciated that the present invention is not limited to use with a z-cut seed plate. Other seed plates having different cuts can be used.

Figure 7:
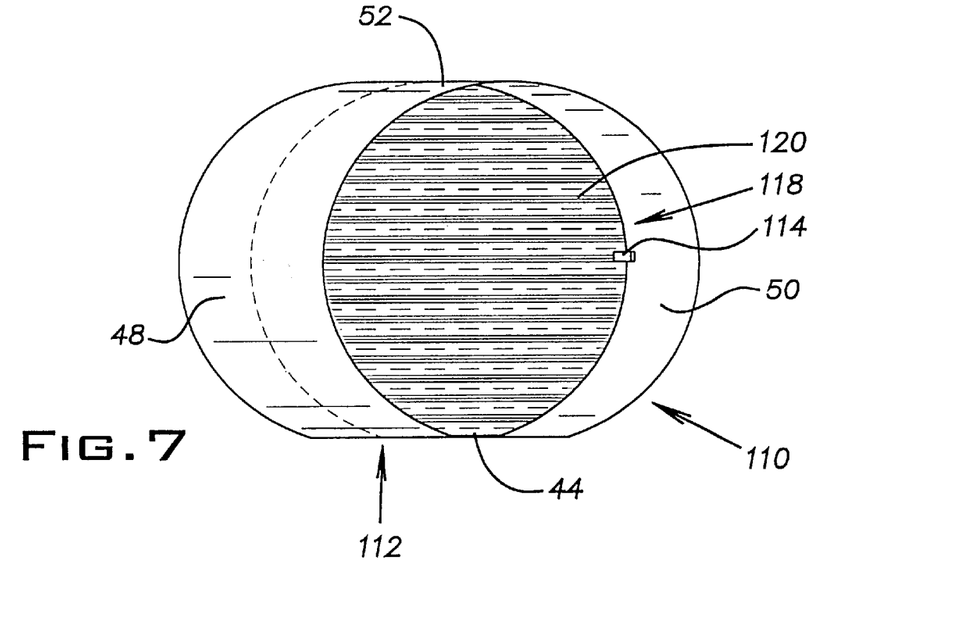
FIG. 7 shows a front perspective view of a third seed-holding assembly.
Figure 8:
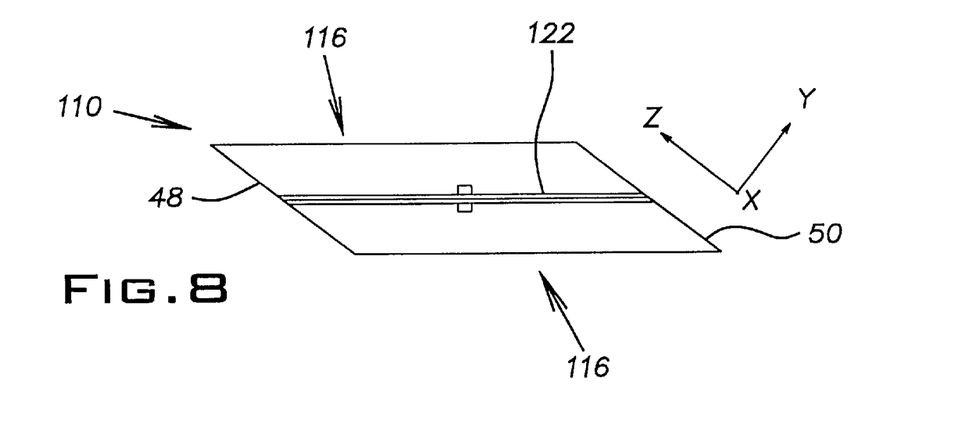
FIG. 8 shows a top view of the third seed-holding assembly.

Referring now to FIGS. 7 and 8, there is shown a third embodiment of the present invention. Specifically, FIGS. 7 and 8 respectively show a schematic front view and a schematic top sectional view of a third seed-holding assembly 110 having essentially the same construction as the seed-holding assembly 32 of the first embodiment except for the differences to be hereinafter described. The restrictor 34 has been replaced by a third restrictor 112 and the upper and lower supports 36, 38 have been replaced by a plurality of side clips 114. The third restrictor 112 has essentially the same construction as the restrictor 34 except top and bottom end portions of the restrictor 34 have been cut away at an angle to provide the third restrictor 112 with angled ends 116 that are parallel to each other. In this manner, the third restrictor 112 has a profile that resembles a parallelogram.

A second seed plate 118 is mounted inside the third restrictor 112 by the side clips 114. The second seed plate 118 is substantially circular and is cut parallel to a rhombohedral face of a parent crystal. For this reason, a seed plate such as the second seed plate 118 is referred to as having a rhombohedral or rhomb cut. The second seed plate 118 has opposing major faces 120 and a circumferential edge 122. The major faces 120 intersect the crystallographic z-axis of the second seed plate 118 at an angle of about 38.25°.

The second seed plate 118 is disposed within the third restrictor 112 so as to have the major faces 120 disposed parallel to the angled ends 116. The circumferential edge 122 adjoins the first and second major walls 48, 50 as well as the first side wall 52 and the first side portion 44 of the third restrictor 112.

The third seed-growing assembly 110 is hung from one of the mounting frames 28 of the rack 26 by wires (not shown) connected to the third restrictor 112 such that the width of the third restrictor 112 is vertically extending. In this manner, the second seed plate 118 is disposed in the autoclave 10 with the major faces 120 extending substantially vertical as shown in FIG. 7.

Under conditions similar to those described above for the first embodiment, a third crystal is grown in the third restrictor 112. The third crystal is generally cylindroidal with a reference flat, and has opposing angled ends that are parallel with each other. The third crystal is ideally suited to produce seed-less circular wafers. In order to produce seed-less circular wafers, a plurality of parallel cuts are made through the third crystal parallel to the second seed plate 118.

Although the preferred embodiments of this invention have been shown and described, it should be understood that various modifications and rearrangements of the parts may be resorted to without departing from the scope of the invention as disclosed and claimed herein. For example, the restrictor 34, the second restrictor 102, and the third restrictor 112 can be composed of materials other than low carbon steel. In addition, passages having configurations different from the upper and lower passages 57, 59 can be formed through the restrictor 34, the second restrictor 102 and the third restrictor 112. Also, the upper and lower passages 57, 59 can be located all over the restrictor 34, the second restrictor 102 and the third restrictor 112 instead of being located just on the front walls 48, 104 and the rear walls 50, 106.

It should also be understood that the present invention can be used to grow crystals other than quartz crystals, such as zinc oxide (ZnO), calcite ($CaCO_3$) and aluminum oxide ($Al2O_3$).

What is claimed is:

1. An apparatus for shaping a crystal grown from a seed crystal, said apparatus comprising:
    an enclosure for disposal around the seed crystal, said enclosure having a plurality of passages extending therethrough; and
    a retaining structure for holding the seed crystal within the enclosure.

2. The apparatus of claim 1 wherein the passages are non-linear in a direction parallel to a cross-section of the enclosure.

3. The apparatus of claim 1 wherein the enclosure has opposing open ends.

4. The apparatus of claim 3, wherein the enclosure is comprised of opposing major walls and opposing first and second side walls, said major walls having the passages formed therein.

5. The apparatus of claim 4, wherein the major walls and the first side wall are arcuate, and the second side wall is planar.

6. The apparatus of claim 4 wherein the major walls and the first and second side walls are integrally formed from a metal sheet having opposing side portions.

7. The apparatus of claim 6, wherein the side portions of the metal sheet are secured together by a fastener so as to form the second side wall; and
    wherein the fastener can be released to permit the side portions of the metal sheet to be moved apart, thereby providing access to the interior of the enclosure.

8. The apparatus of claim 4, wherein the passages in each of the major walls are comprised of a plurality of upwardly-directed passages and a plurality of downwardly-directed passages.

9. The apparatus of claim 8, wherein a plurality of upper protuberances and a plurality of lower protuberances are formed in each of the major walls; and
    wherein the upper protuberances define the upwardly-directed passages, and the lower protuberances define the downwardly-directed protuberances.

10. The apparatus of claim 9, wherein the upper and lower protuberances are generally semi-conical.

11. The apparatus of claim 1 wherein the enclosure has a generally elliptical cross-section.

12. The apparatus of claim 1 wherein the enclosure is rectangular.

13. An assembly for hydrothermally growing a crystal, said assembly comprising:
    a pressure vessel containing a basket filled with feed material and a mineralizing solution, said basket being immersed in the mineralizing solution;
    a rack having a mounting frame, said rack being disposed within the pressure vessel, above the mineralizing solution;
    a seed plate having opposing major faces; and
    an apparatus suspended from the mounting frame, said apparatus including:
        an enclosure that, when viewed in a cross section taken at a right angle to a longitudinal axis of the enclosure, completely surrounds the seed plate; and
        a retaining structure that holds the seed plate within the enclosure such that the seed plate is fully disposed within the enclosure.

14. The assembly of claim 13, wherein the feed material and the seed plate are comprised of quartz.

15. The assembly of claim 13, wherein the enclosure is comprised of opposing major walls and opposing first and second side walls, said major walls each having a plurality of passages formed therein.

16. The assembly of claim 15, wherein the enclosure further comprises opposing open ends.

17. The assembly of claim 16, wherein the retaining structure holds the seed plate within the enclosure such that the major faces are directed toward, and spaced inward from, the major walls.

18. The assembly of claim 17, wherein the seed plate is substantially rectangular and has a z-cut; and wherein the retaining structure holds the seed plate such that a z-axis of the seed plate is parallel to a cross-section of the enclosure.

19. The assembly of claim 18, wherein the passages are non-linear in the direction of the z-axis of the seed plate.

20. The assembly of claim 16, wherein the retaining structure holds the seed plate within the enclosure such that the major faces are directed toward, and spaced inward from, the open ends.

21. The assembly of claim 20, wherein the seed plate is substantially circular and has a rhombohedral cut.

22. An apparatus for shaping a crystal grown from a seed crystal, said apparatus comprising:

an enclosure for disposal around the seed crystal, said enclosure having open ends and at least one passage extending therethrough, said passage being non-linear in a direction parallel to a cross-section of the enclosure taken at a right angle to a longitudinal axis of the enclosure; and a retaining structure for holding the seed crystal within the enclosure such that the seed crystal is substantially disposed within the enclosure.

23. The apparatus of claim 22, wherein the enclosure is comprised of opposing major walls, one of which has the passage extending therethrough.

24. The apparatus of claim 23, wherein the major walls are arcuate.

25. The apparatus of claim 22, wherein the enclosure has a generally elliptical cross-section.

* * * * *